United States Patent
Walker

(10) Patent No.: US 10,134,696 B2
(45) Date of Patent: Nov. 20, 2018

(54) SPOKED SOLDER PAD TO IMPROVE SOLDERABILITY AND SELF-ALIGNMENT OF INTEGRATED CIRCUIT PACKAGES

(71) Applicant: Myron Walker, Redmond, WA (US)

(72) Inventor: Myron Walker, Redmond, WA (US)

(*) Notice: Subject to any disclaimer, the term of this patent is extended or adjusted under 35 U.S.C. 154(b) by 0 days.

(21) Appl. No.: 14/977,601

(22) Filed: Dec. 21, 2015

(65) Prior Publication Data

US 2016/0233180 A1 Aug. 11, 2016

Related U.S. Application Data

(60) Provisional application No. 62/094,842, filed on Dec. 19, 2014.

(51) Int. Cl.
| | | |
|---|---|---|
| *H01L 23/482* | (2006.01) | |
| *H01L 23/488* | (2006.01) | |
| *H01L 23/00* | (2006.01) | |
| *H05K 1/11* | (2006.01) | |
| *H05K 3/34* | (2006.01) | |
| *H05K 1/18* | (2006.01) | |

(52) U.S. Cl.
CPC ............. *H01L 24/05* (2013.01); *H05K 1/111* (2013.01); *H05K 1/181* (2013.01); *H05K 3/3436* (2013.01); *H01L 2224/05551* (2013.01); *H01L 2224/05555* (2013.01); *H01L 2224/05557* (2013.01); *H01L 2224/05563* (2013.01); *H05K 2201/09381* (2013.01); *H05K 2203/048* (2013.01); *Y02P 70/611* (2015.11); *Y02P 70/613* (2015.11)

(58) Field of Classification Search
CPC ........... H01L 24/05; H01L 2224/05551; H01L 2224/05555; H01L 2224/05557; H01L 2224/05563; H05K 1/111; H05K 1/181; H05K 3/3436; H05K 2201/09381; H05K 2203/048; Y02P 70/611; Y02P 70/613
USPC ........................................................ 257/779
See application file for complete search history.

(56) References Cited

U.S. PATENT DOCUMENTS

| | | | | |
|---|---|---|---|---|
| 5,900,674 A | * | 5/1999 | Wojnarowski | ....... H05K 3/3436 156/155 |
| 6,054,563 A | * | 4/2000 | Alas | ......................... B01J 31/04 534/15 |

(Continued)

FOREIGN PATENT DOCUMENTS

| | | |
|---|---|---|
| JP | S61102089 A | 5/1986 |
| JP | H0923099 A | 1/1997 |

(Continued)

OTHER PUBLICATIONS

Cambridge English Dictionary, definition of "shape", [online] Cambridge University Press 2017, [retrieved on Mar. 1, 2017]. Retrieved from the Internet <URL: http://dictionary.cambridge.org/us/dictionary/english/shape>.*

*Primary Examiner* — Sitaramarao S Yechuri
(74) *Attorney, Agent, or Firm* — AEON Law; Adam L. K. Philipp; David V. H. Cohen

(57) ABSTRACT

A center pad or paddle that is shaped with three or more curved spires which are symmetrical in form about axis that radiate from the center of the integrated circuit package, which takes advantage of the surface tension of solder to produce increased rotational align forces and increased centering forces during package soldering when aligned to a matching shaped pad on the surface of a circuit board.

14 Claims, 22 Drawing Sheets

(56) References Cited

U.S. PATENT DOCUMENTS

| | | | |
|---|---|---|---|
| 7,902,666 B1* | 3/2011 | Hsu | H01L 23/49838 257/734 |
| 2002/0071642 A1* | 6/2002 | Nakata | G02B 6/4232 385/88 |
| 2002/0092672 A1* | 7/2002 | Primavera | H05K 1/111 174/250 |
| 2003/0057515 A1* | 3/2003 | Fillion | H01L 23/49811 257/508 |
| 2004/0020972 A1* | 2/2004 | Miyajima | B23K 1/0016 228/180.21 |
| 2007/0126030 A1* | 6/2007 | Ito | H01L 23/3114 257/211 |
| 2009/0091025 A1* | 4/2009 | Wong | H05K 3/3478 257/737 |
| 2009/0211087 A1* | 8/2009 | Oggioni | B81C 1/00269 29/834 |
| 2011/0067911 A1* | 3/2011 | Ishikawa | B23K 1/0008 174/261 |
| 2013/0323526 A1* | 12/2013 | Hasin | H01L 31/18 428/599 |

FOREIGN PATENT DOCUMENTS

| | | |
|---|---|---|
| JP | H09107173 A | 4/1997 |
| JP | 2004165288 A | 6/2004 |
| WO | 2005/122655 A2 | 12/2005 |

\* cited by examiner

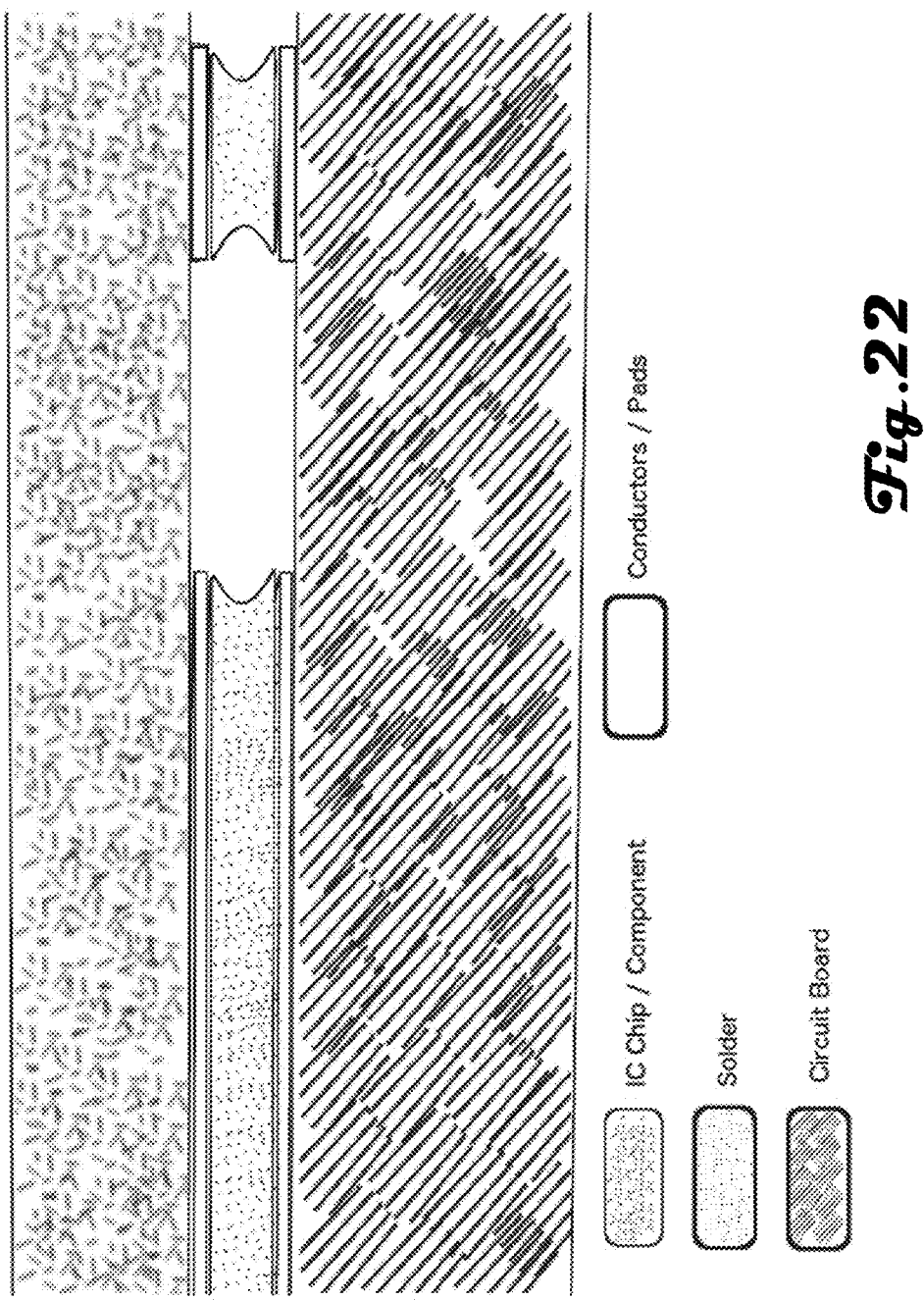

SPOKED SOLDER PAD TO IMPROVE SOLDERABILITY AND SELF-ALIGNMENT OF INTEGRATED CIRCUIT PACKAGES

FIELD

This disclosure relates to solder pads, in particular, to solder pads with three or more spokes for integrated circuit packages and/or circuit boards.

BACKGROUND

One of the challenges encountered when soldering high lead count components to a circuit board is the proper alignment of the chip. Proper alignment is particularly challenging in hand soldered projects, but can also create difficulties in automated solder projects.

BRIEF DESCRIPTION OF THE DRAWINGS

The aspects of the present disclosure are best understood from the detailed description when read in relation to the accompanying drawings. The drawings illustrate a variety of different aspects, features, and embodiments of the disclosure, as such it is understood that the illustrated embodiments are merely representative and not exhaustive in scope. The disclosure will now be described with reference to the accompanying drawings, wherein like numbers refer to like elements.

FIG. 22 illustrates a side view of a cross-section of a component, solder, and circuit board in accordance with one embodiment.

DETAILED DESCRIPTION

Figure 1:
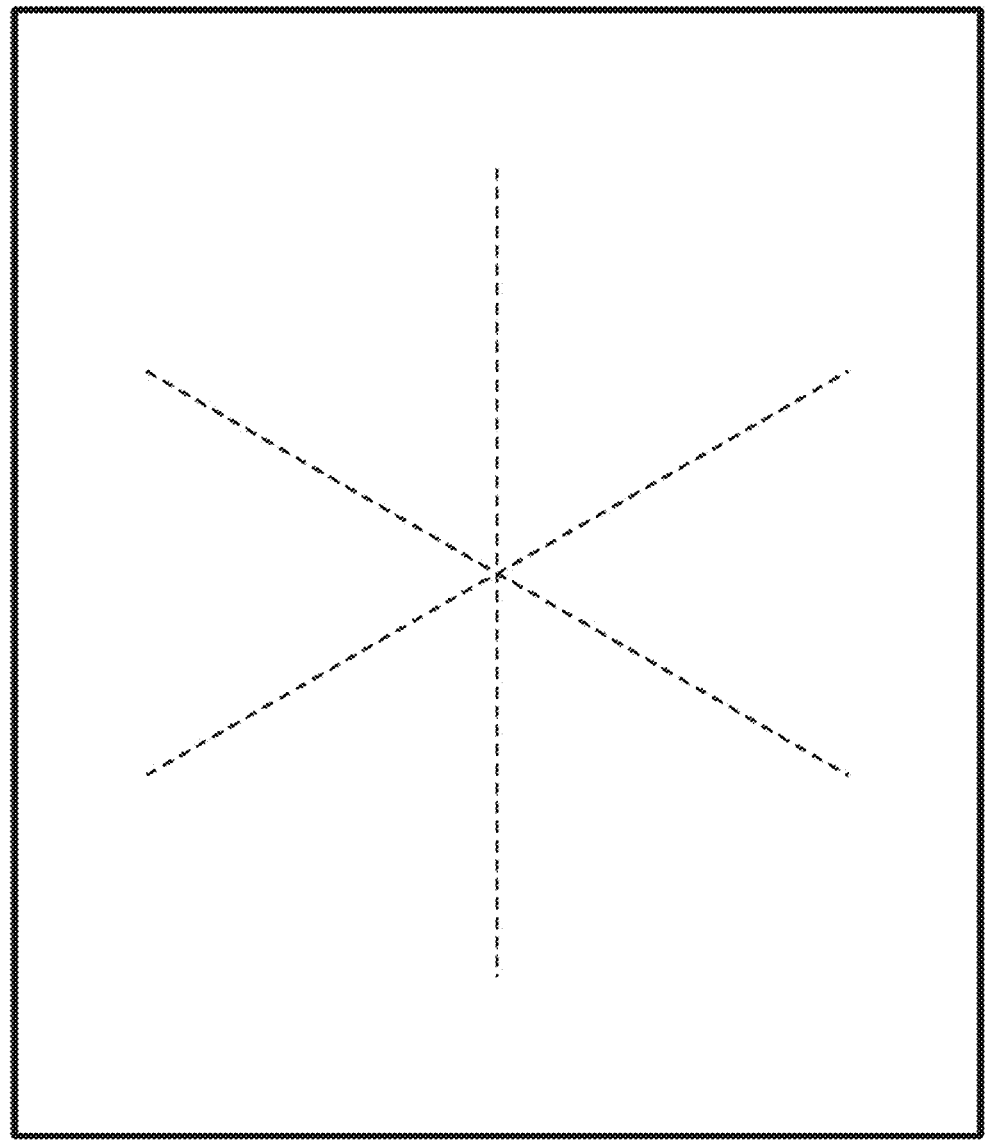
FIG. 1 illustrates a plan view of radial axes arranged in a symmetrically distributed layout around an installation center point in accordance with one embodiment.

This document describes a method of shaping a chip's center pad and corresponding circuit board pad so as to re-align the surface tension and intermolecular forces in such a way that will tend to redirect the forces more towards a perpendicular orientation with radial axis extending from a central point on a pad. The realignment of surface tension and intermolecular forces creating a rotational and positional centering effect on the IC chip based on the balancing of the forces distributed around the perimeter of the pad. In accordance with various embodiments of the invention, spoked solder pad apparatus, systems, and methods are described that overcome the hereinafore-mentioned disadvantages of the heretofore-known solder pads of this general type to improve solderability and self-alignment of integrated circuit packages and/or circuit boards. More specifically, the described embodiments provide at least one spoked solder pad that is shaped with three or more curved spires which are symmetrical in form about axis that radiate from the center of the integrated circuit package. The wetting action, intermolecular, and surface tension of solder tend to apply forces on surface mounted integrated circuit components that help to center them. The intermolecular and surface tension forces that are involved in the proper wetting action of solder flowing over the extent of a pad surface tending to balance forces between the surface mounted component and the pad in such a way as to have a central point where the forces are in balance the residual effect of which is the centering of the component with respect to the pad.

Larger pad count Integrated Circuit (IC) packages are particularly more difficult to align. They can sometimes have a square center pad that helps transfer heat to the board from the IC and also aids in alignment of the component. The issue with square center pads is that The issue with the square center pads is that the intermolecular and surface tension forces will have a tendency to align themselves along the edge of the pad and with a square center pad the edge is oriented in a way as to provide only the minimum amount of rotational leverage on the component. Orienting the intermolecular and surface tension forces perpendicular to a perimeter that corresponds to radial spires will applies those forces to pad spires that can act as levers to rotationally align the component around a center point. A square pad also does not provide as good of a visual queue as to how much solder is needed for the pre-fill of the center pad in order to solder the component onto the printed circuit board. Additionally, square pads only apply a minimal amount of force toward centering the chip and because of their shape the square pads require more exact amounts of solder in order for the centering actions to take effect.

Reference is now made in detail to the description of the embodiments as illustrated in the drawings. In the following detailed description, reference is made to the accompanying drawings which form a part hereof, and in which are shown, by way of illustration, specific embodiments in which the disclosure may be practiced. Various aspects of the illustrative embodiments will be described using terms commonly employed by those skilled in the art to convey the substance of their work to others skilled in the art. However, the embodiments described herein may be practiced with only some of the described aspects. For purposes of explanation, specific numbers, materials, and configurations may be set forth to provide a thorough understanding of the illustrative embodiments. However, the embodiments described herein may be practiced without the specific details. In other instances, well-known features are omitted or simplified in order not to obscure the illustrative embodiments. Further, various operations may be described as multiple discrete operations, in turn, in a manner that may be helpful in understanding the embodiments described herein; however, the order of description should not be construed as to imply that these operations are necessarily order dependent. In particular, these operations need not be performed in the order of presentation.

Throughout the specification and drawings, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. Reference in the specification to "one embodiment" or "an embodiment" means that a particular feature, structure, or characteristic described in connection with the embodiment is included in at least one embodiment of the disclosure, but are not necessarily included on all embodiments of the disclosure. The term "Solder" as used herein typically refers to any of various alloys fused and applied to the joint between two metal objects to unite them without heating the objects to the melting point. The term "Pad" as used herein typically refers to a shaped solderable area that provides for a solder connection point between a component and a board. Additionally, modern IC chips can have "matching pads" which constitute separate pads on both the IC chip and the circuit board intended to match each other. The term "Surface Tension" as used herein typically refers to the attractive force exerted upon the surface molecules of a liquid by the molecules beneath that tends to draw the surface molecules into the bulk of the liquid and makes the liquid assume the shape having the least surface area. Accordingly, Surface tension is the elasticlike force existing in the surface of a body, especially a liquid, tending to minimize the area of the surface, that is caused by asymmetries in the intermolecular forces between surface molecules. The term "Cohesion" as used herein typically refers to the molecular force between particles within a body or substance that acts to unite them. The term "Wetting Action" as used herein typically refers to a solvent action that takes place when hot molten solder dissolves and melts the surfaces being soldered forming a new alloy that is a blend of the solder and the metal of the original surface. Wetting Action is used to describe an extent to which a molten substance will tend to join together with another metal by forming an intermolecular bond at a surface junction. The term "Rotational Alignment" as used herein typically refers to the alignment of a component and a set of radial axis that extend out from the center of a component over a matching set of radial axis that extend out from the center of the installation location so that the axes of both pads are aligned with each other. The term "Center Alignment" as used herein typically refers to the alignment of the center of a component over the center of its installation location.

Figure 2:
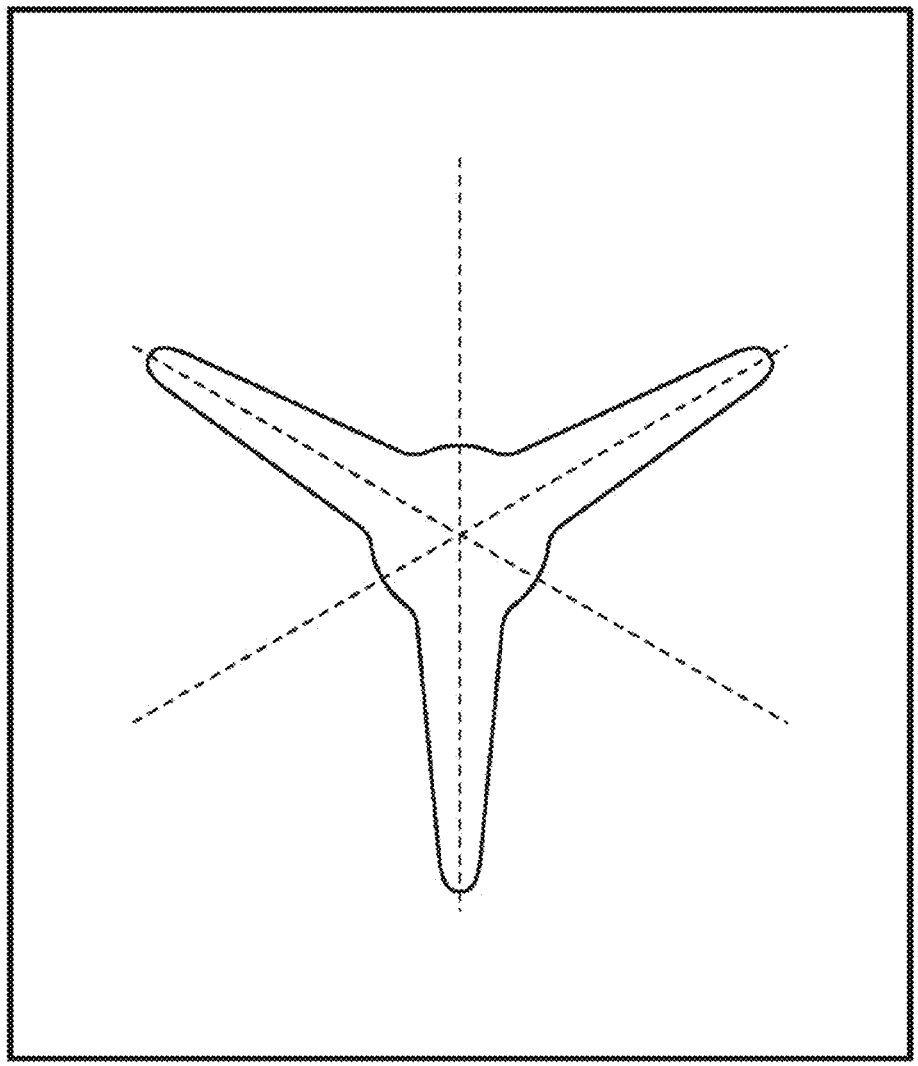
FIG. 2 illustrates a top plan view of a solder pad with three or more solderable lobes, each solderable lobe symmetrically extending along a radial axis, in accordance with one embodiment.

Referring to FIG. 1, a plan view of radial axes arranged in a symmetrically distributed layout around an installation center point is shown in accordance with one embodiment. In order to make manual soldering of high pad count chips easier, the center pad can be shaped in a way where it has three or more rounded symmetrical spires that extend out from a smaller center region. Referring to FIG. 2, a top plan view of a solder pad with three or more solderable lobes is shown in accordance with one embodiment. Each solderable lobe symmetrically extends along a radial axis. These spires are symmetrical about spoke like radial axis that are equidistantly distributed around the center of the component (see e.g., FIG. 1 and FIG. 2). These equidistant spires increase the edge length of the center pad and form along the axis.

Figure 3:
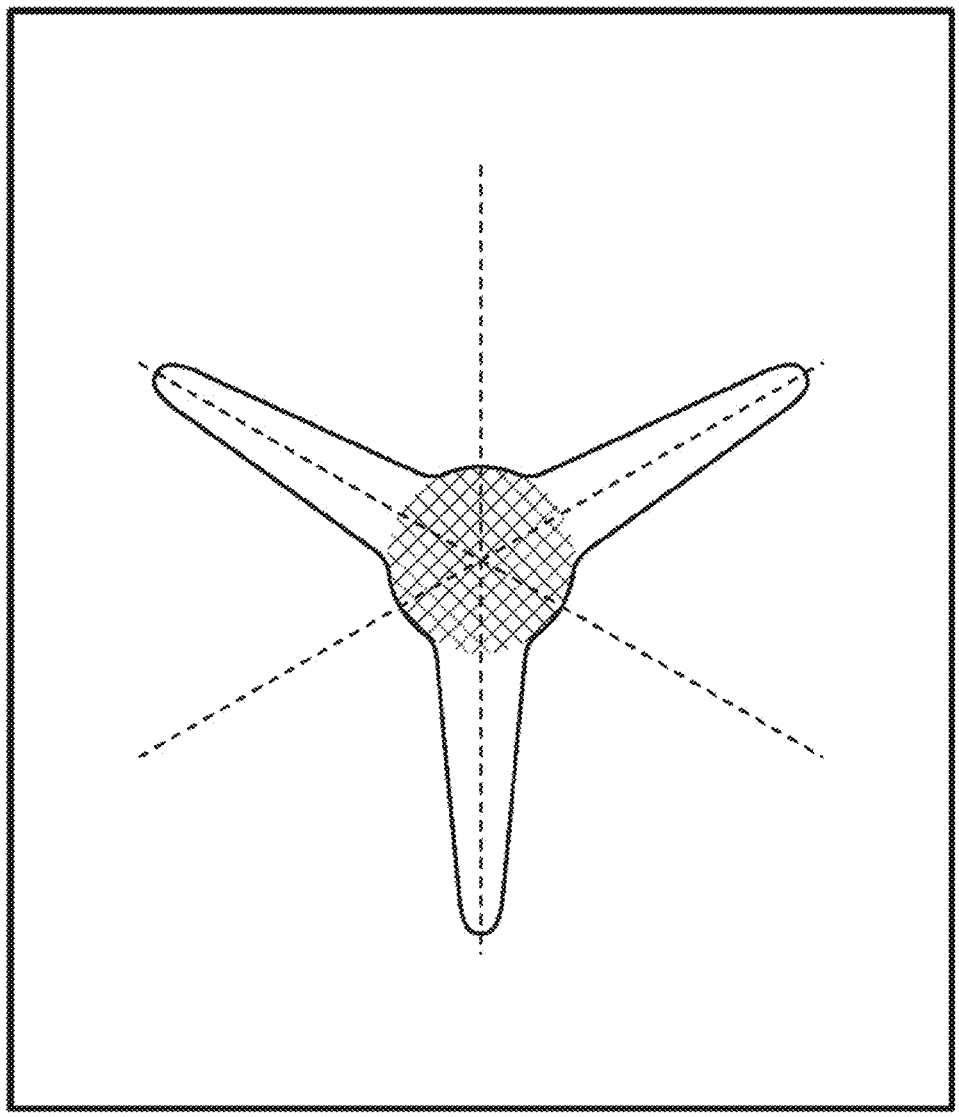
FIG. 3 illustrates a view of solder prefill on the solder pad as shown in FIG. 2.

Referring to FIG. 3, a top plan view of solder prefill on the solder pad is shown accordance with one embodiment. Solder may be pre-filled in the center region of the spoke shaped pad on the board. The center region of the center pad acts as a gauge for the amount of solder that should be put on the pad (see e.g., FIG. 3). A component with a matching spoke shaped pad described above is placed on the pad with a minimum degree of rotational alignment error. A condition now exists where the heating of the solder on the center pad and the heating of the component pad will cause the solder to join the component to the board starting at the center.

Having the correct solder quantity on a connection helps to judge the quality of a solder connection. When a solder connection is being made, a layer of oxidation on the surface of the metals being joined can prevent the intermolecular attraction from occurring and prevent solder from completely wetting over the surface of the pad. The proper wetting of the solder onto the component leads and the pad is an indicator that the conditions that created a solder connection were sufficient to create a high quality intermolecular bond between the solder and the metal on the pads of the component and board.

When adequate soldering conditions are present, including the heat and cleanliness of the surfaces, the solder will wet over the entire surface of the pads on the component and board and will establish a balance of opposing forces between the surface tension of the solder and the intermolecular attraction of the solder. This balance of opposing forces is visually observed when the solder quantity is sufficient for the solder to form a concave filet between the surfaces being joined where the solder flows smoothly into the surfaces. The concave fillet will orient itself perpendicular to the edges of the metal surfaces being soldered, such as the pads on the component and the board.

When an excessive amount of solder is used in creating a solder connection, the solder connecting the surfaces will become convex and extrude out like a bubble. In this excessive solder case, detection of whether the solder is wetting smoothly onto the pad surfaces being soldered cannot be accomplished through standard visual inspection. Thus, the excessive solder case prevents the detection of solder connection defects due to improper heat or oxidized surfaces. More specifically, if improper heat or oxidation was present then the solder connection could be bad but remain undetected due to excessive solder.

Figure 4:
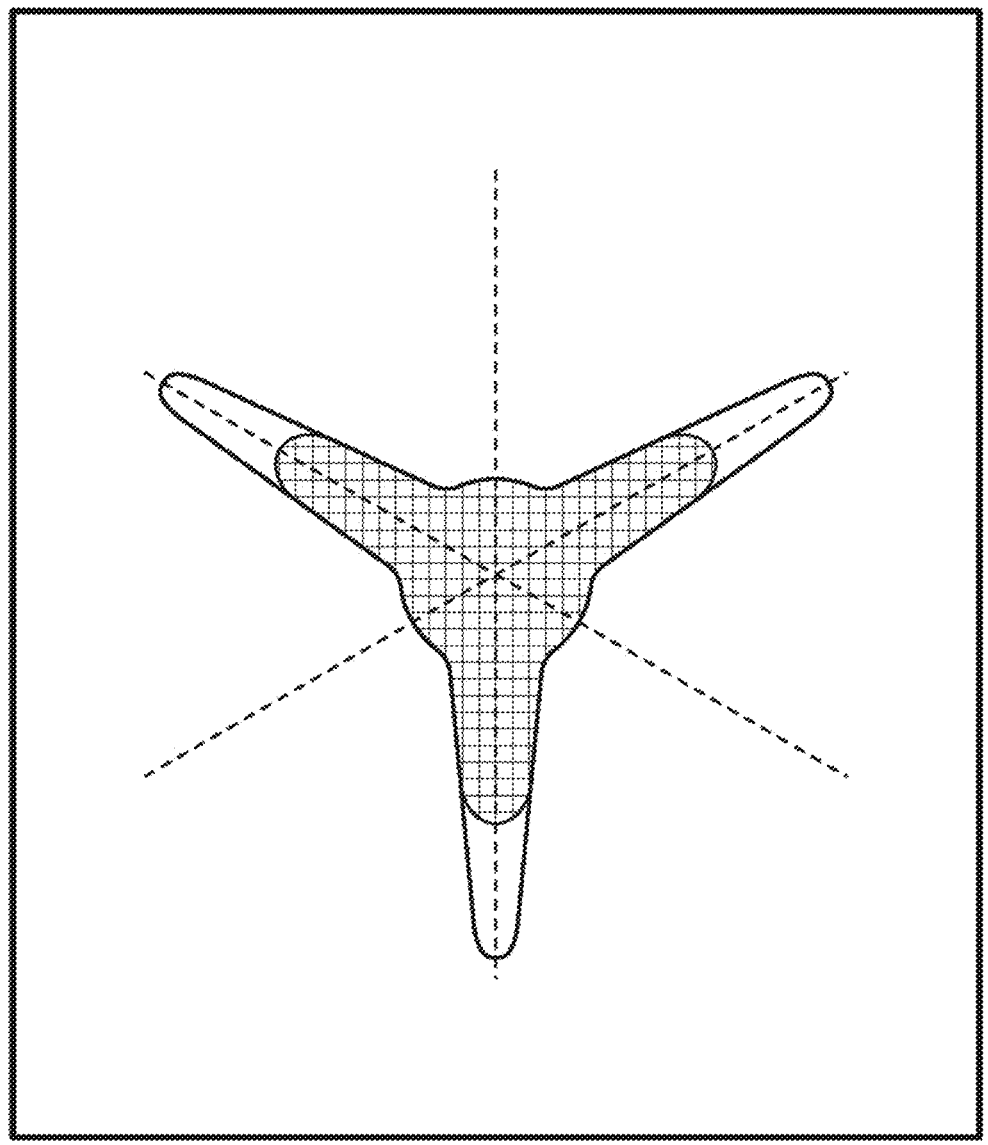
FIG. 4 illustrates a top plan view of the solder prefill wetting along each radial axis when soldered in accordance with one embodiment.
Figure 5:
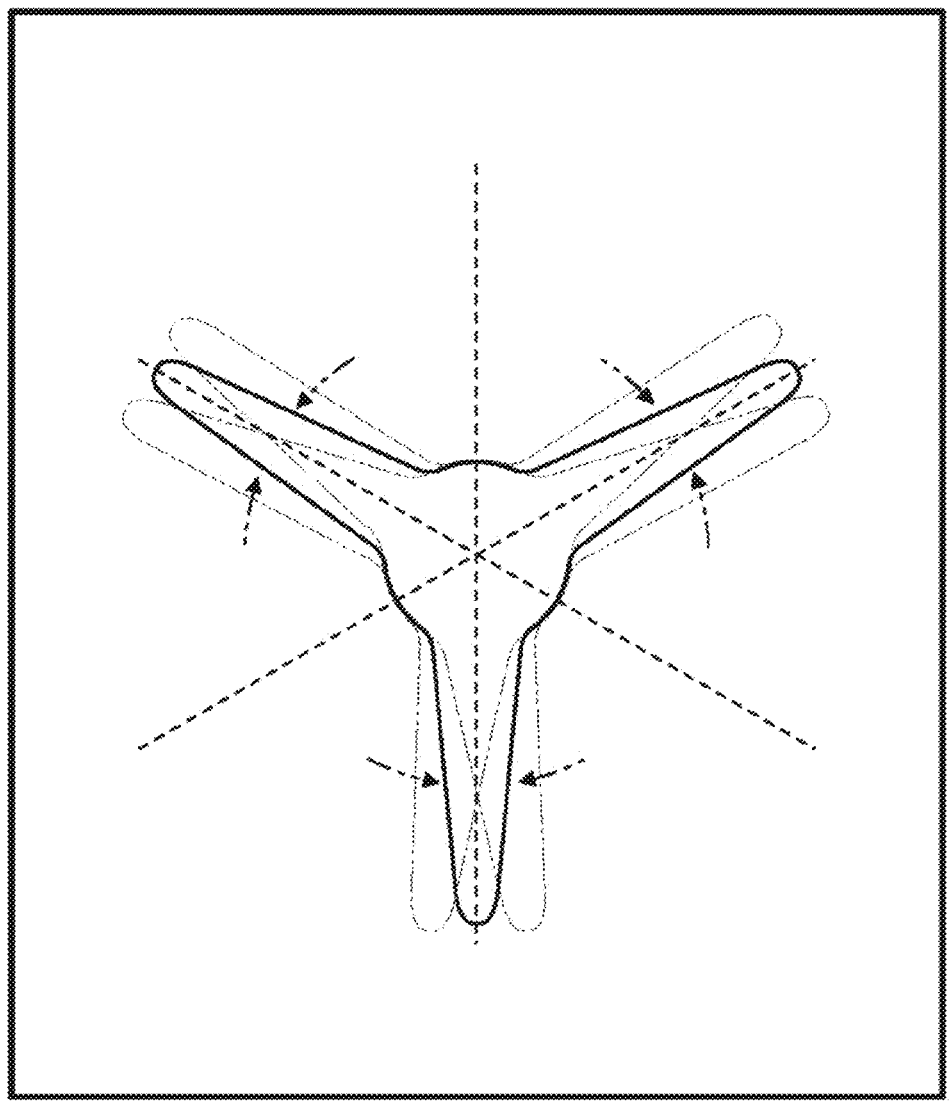
FIG. 5 illustrates a top plan view of a solder pad with rotationally misaligned solder pads from the matching solder pad rotating into alignment in accordance with one embodiment.

Referring to FIG. 4, a top plan view of the solder prefill wetting along each radial axis when soldered is shown in accordance with one embodiment. As the component is moved down closer to the board, the solder will wet or flow out from the center evenly along the spires forming solder fillets between the component spires and installation pad spires (see e.g., FIG. 4). The solder fillets are centered along the radial axis running down the center of the spires with the surface tension and intermolecular forces of the solder with the pad causing a rotational force (see e.g., FIG. 5) that will pull and/or rotate the spires on the component into alignment with the matching spires on the board.

Figure 6:
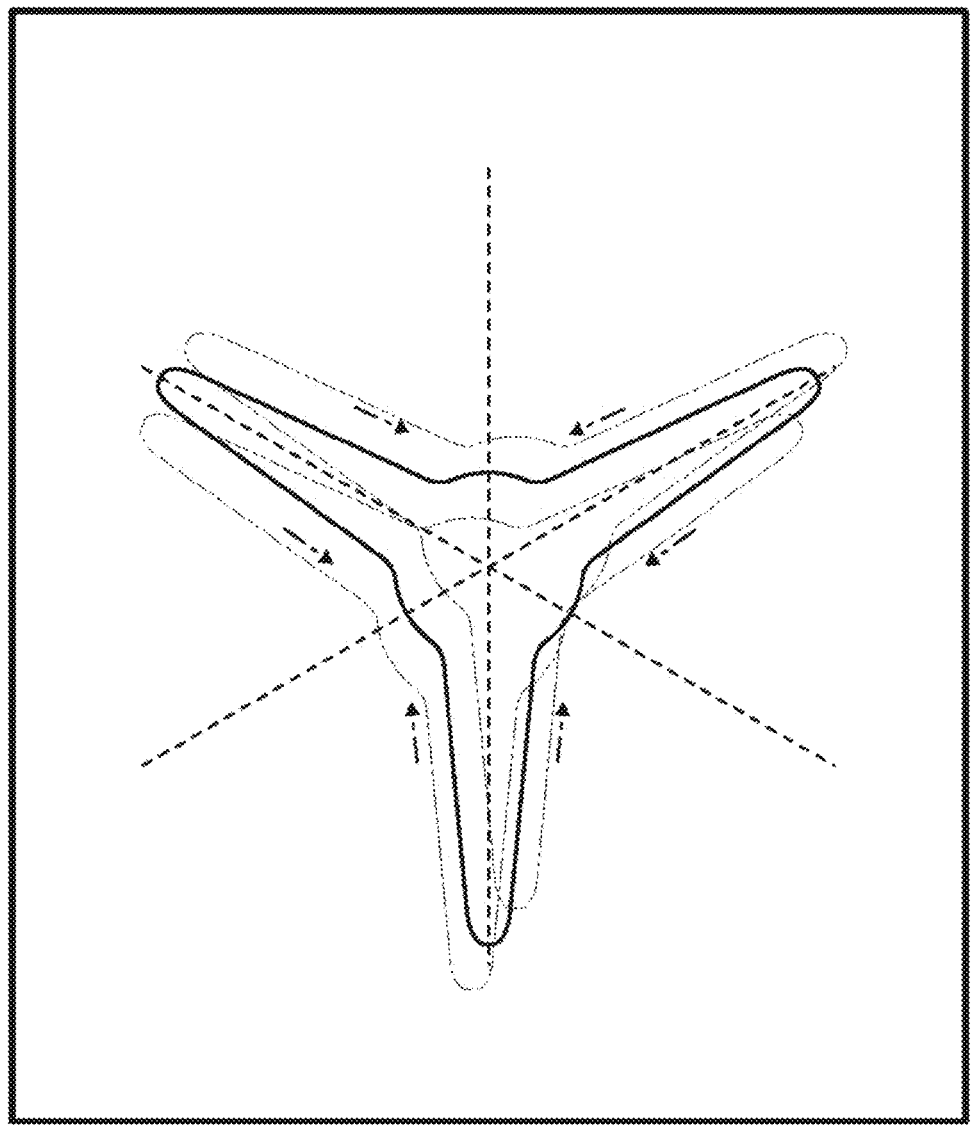
FIG. 6 illustrates a top plan view of a solder pad with off center solder pads misaligned from the matching solder pad and moving into alignment in accordance with one embodiment.

Referring to FIG. 6, a top plan view of a solder pad with off center solder pads misaligned from the matching solder pad are shown in which the misaligned pads are moving into alignment in accordance with one embodiment. The rotational force along the radial axis cause both a rotational alignment force, and the interaction of the force between all the spires results in a centering alignment force (see e.g., FIG. 6).

Figure 7:
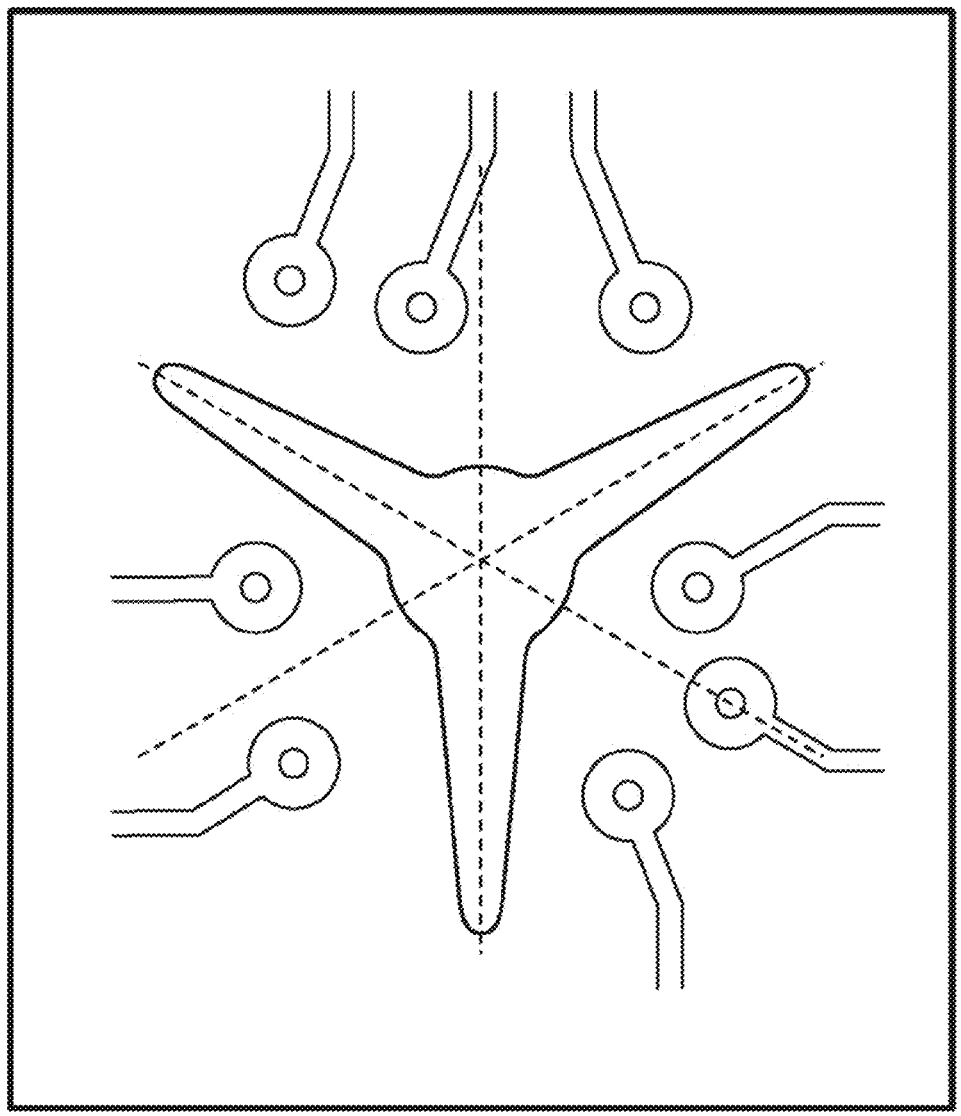
FIG. 7 illustrates a top plan view of a solder pad with integrated circuit elements in unused adjacent space in accordance with one embodiment.

Referring to FIG. 7, a top plan view of a solder pad with integrated circuit elements placed in the unused adjacent space is shown in accordance with one embodiment The radial spire shape of the center pad creates some void space on the board under the component where circuit connections such as through hole via's can be placed. This extra space can result in more compact component densities on the circuit board (see e.g., FIG. 7).

Moreover, when utilizing a center pad with radial spires, an important chip misalignment indicator feature can be added to the chip. For example, in one embodiment, when an odd number of spires are used with a rectangular IC package are used with the center pad (or any number of spires that does not match the number of sides of the chip). An indicator spire may provide alignment. More specifically, the indicator spire is aligned so that the radial axis coming out from the center of the chip that the indicator spire centers on is pointed perpendicular to the edge of a side of the chip with a defined relative relationship to pin 1 and a correspondingly aligned center pad is on the board. Later, when the solder is flowed for the center spire, the chip will rotate to align the spires on the chip with the spires on the board relative to the central pad. More specifically, when pin one is in the correct position, the IC chip will self-align into the correct position with respect to all other pads around the outside of the IC chip. In one embodiment, if the chip was initially placed with pin 1 out of position, then when the solder is flowed on the center pad and the spires on the board and the IC chip align themselves, the IC chip will rotate to a position that is not in alignment with the chip outline on the board and will readily appear obviously misaligned providing a clear indicator of the misplacement of pin 1 of the IC chip.

The variations in the layouts depicted in FIGS. 2 and 8-14 are intended to show how changes to the pad shape can result in slight changes in the characteristics of solder wetting or flow rate and changes to the orientation of the surface tension and intermolecular forces as solder wets along the pad spires. More specifically, changes in edge shape of the spires can effect solder wetting or flow rates, direction of force over time, movement rate of the component over time as well as overall solder flow capacity. The pointed spires (see e.g., FIGS. 12-14) represent a linearly decreasing pad surface for the solder to flow into as well as an edge with a linear orientation with the axis. Including curves in the shape of the spires (see e.g., FIGS. 2, 8, and 9) can change the application of force over time on the solder as it wets along the edge of the spires from a linear changing force to a non-linear changing force.

Figure 8:
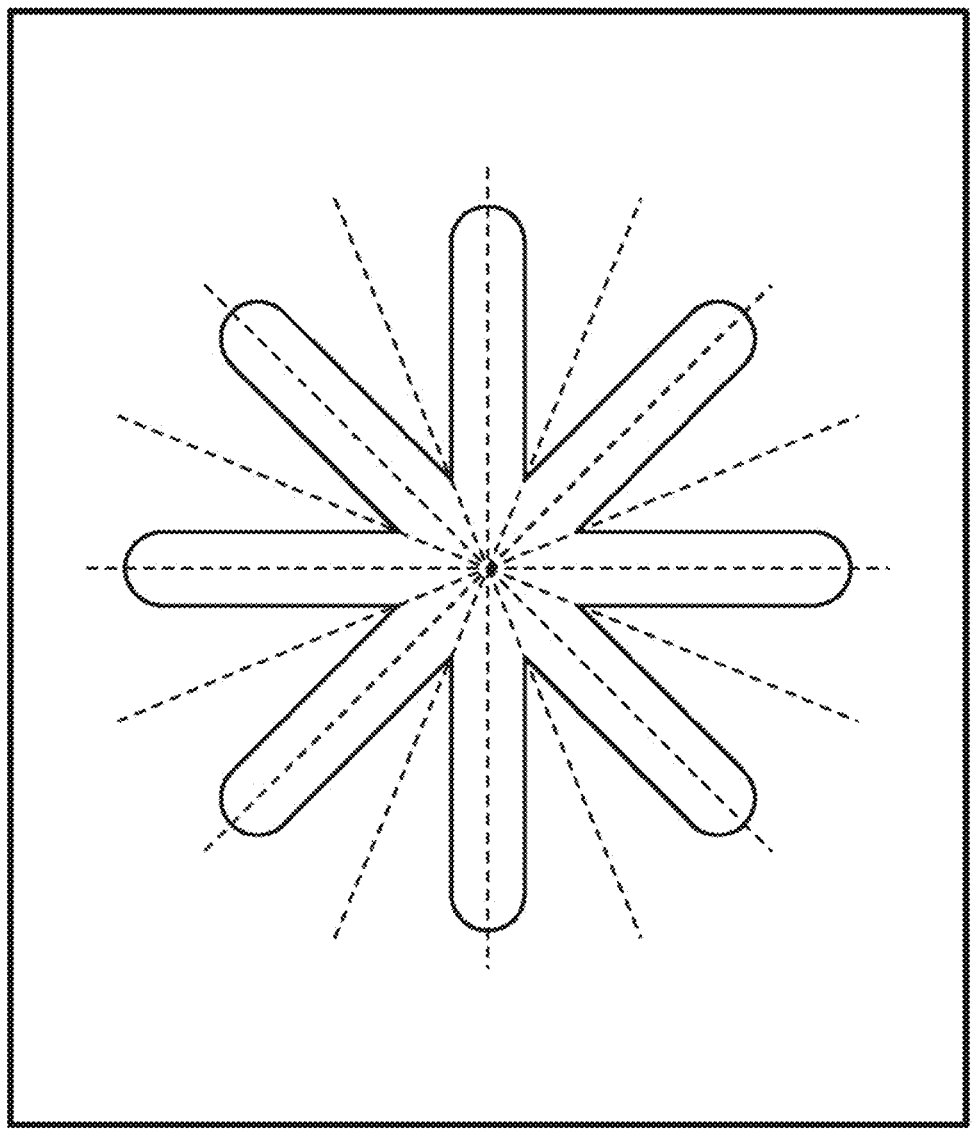
FIG. 8 illustrates a top plan view of a solder pad having straight solder lobes symmetrically extending along radial axes, each solder lobe having a rounded end in accordance with one embodiment.

Referring to FIG. 8, a top plan view of a solder pad having straight solder lobes symmetrically extending along radial axes is shown in accordance with one embodiment. Each solder lobe has a rounded end in accordance with one embodiment. Additionally, the increased surface areas on each of the solder fillets under the center pad act like the fins on a heat sink and significantly increase the contact region between the center pad and the air around it. This results in more heat transfer from the solder to the air under the chip. This heat transfer improvement applies to each of the different spoked solder pad layouts shown in FIGS. 2 and 8-14.

Figure 9:
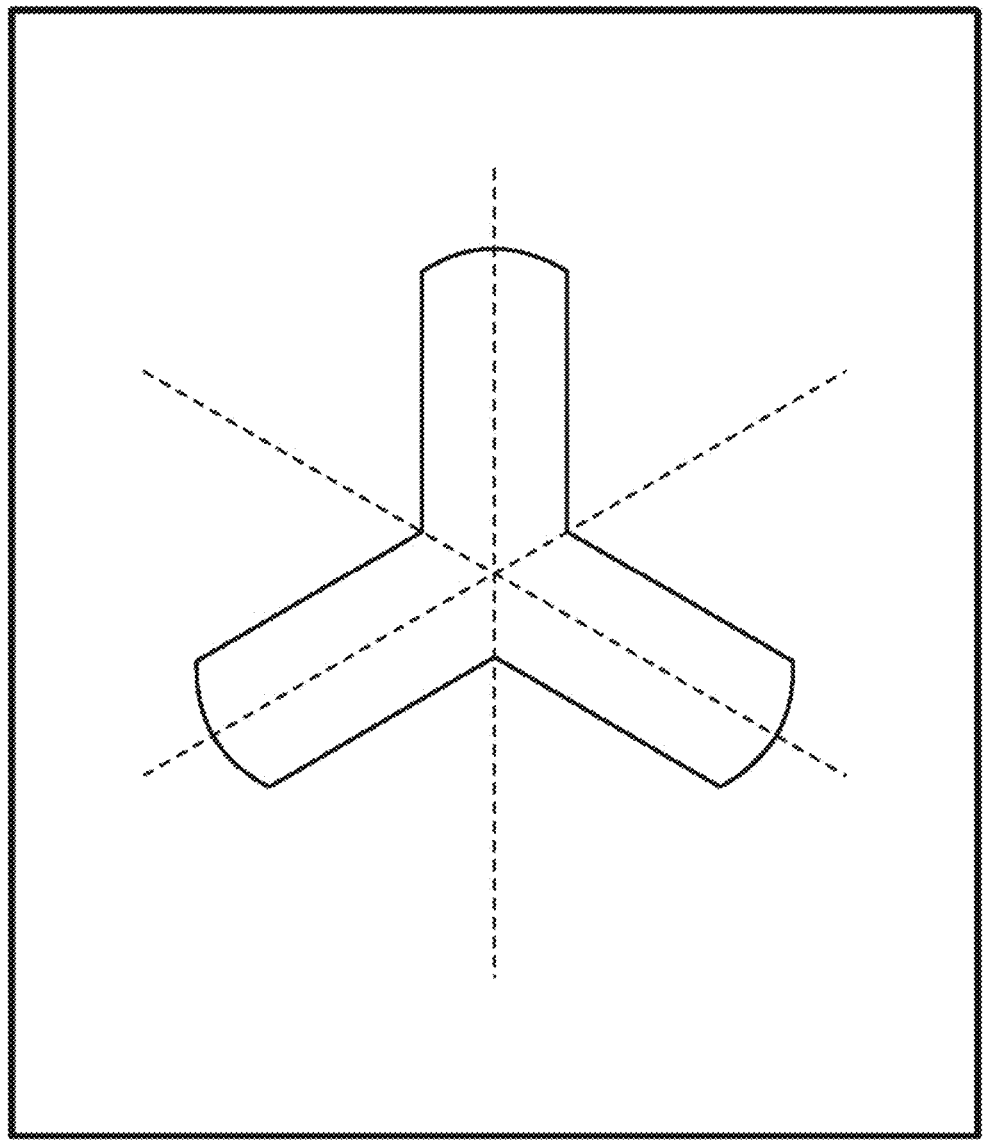
FIG. 9 illustrates a top plan view of a solder pad having straight solder lobes, each solder lobe symmetrically extending along a radial axis and having an arched end in accordance with one embodiment.

Referring to FIG. 9, a top plan view of a solder pad having straight solder lobes, each solder lobe symmetrically extending along a radial axis and having an arched end is shown in accordance with one embodiment.

Figure 10:
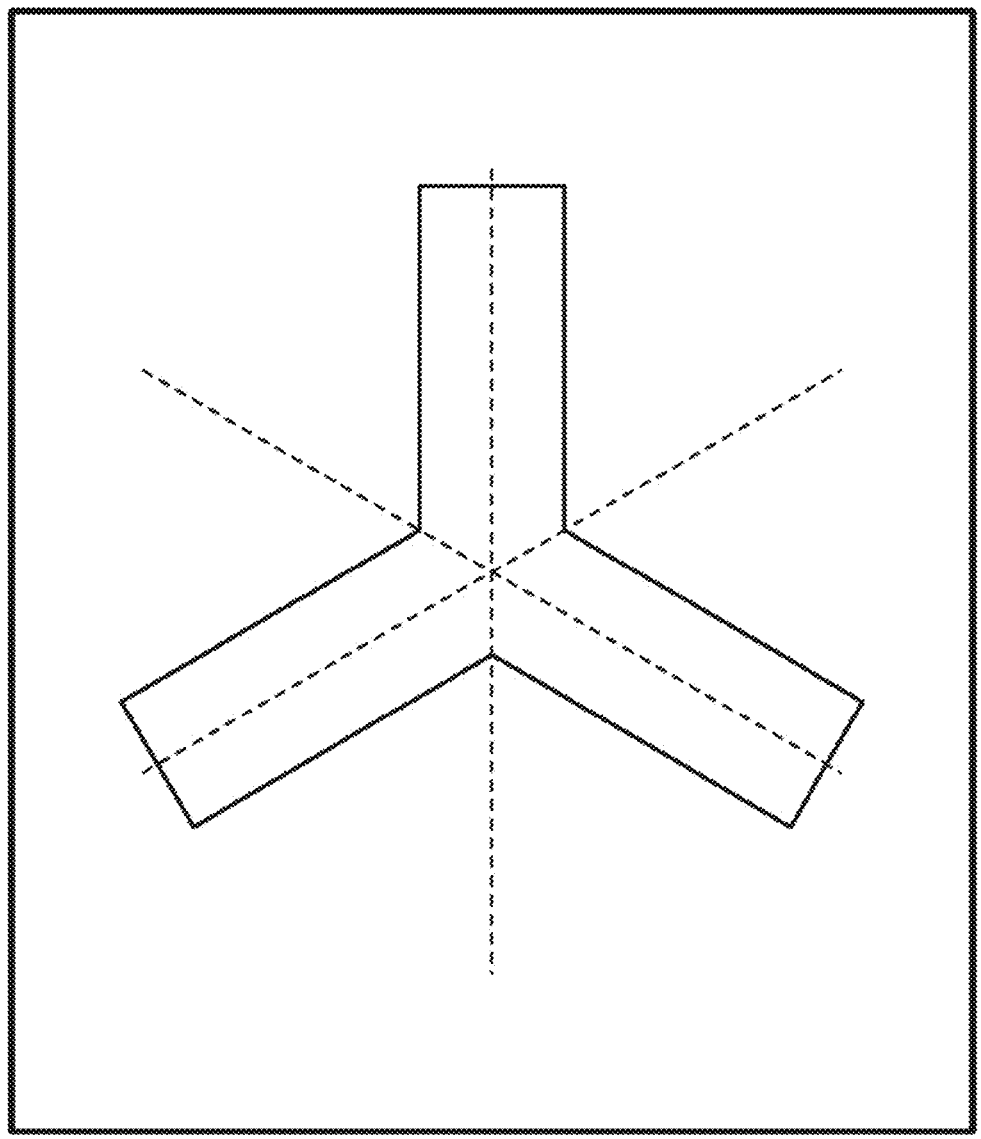
FIG. 10 illustrates a top plan view of the solder pad having straight solder lobes, each solder lobe symmetrically extending along a radial axis and having a straight end in accordance with one embodiment.

Referring to FIG. 10, a top plan view of the solder pad having straight solder lobes, each solder lobe symmetrically extending along a radial axis and having a straight end is shown in accordance with one embodiment.

Figure 11:
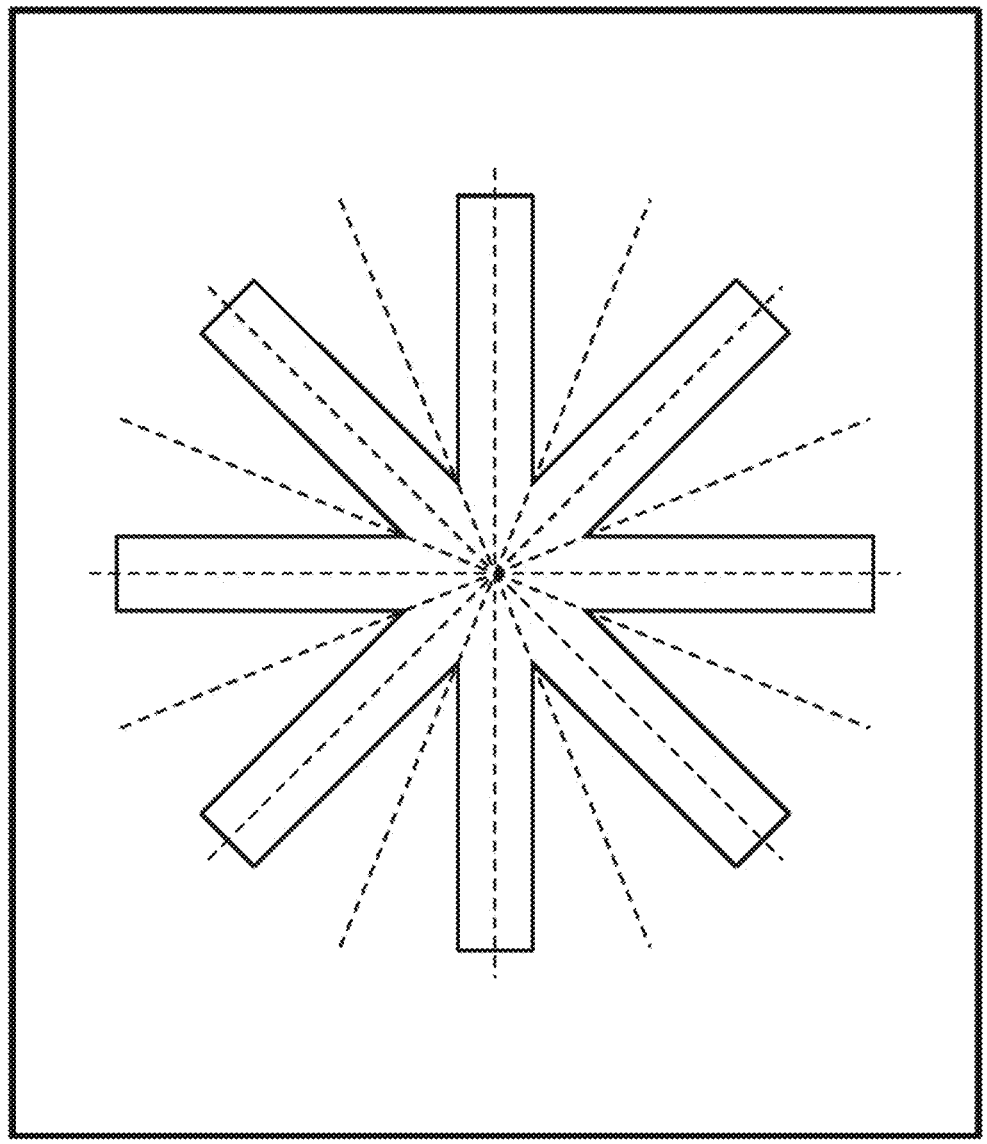
FIG. 11 illustrates a top plan view of the solder pad shown in FIG. 8, each solder lobe having a straight end in accordance with one embodiment.

Referring to FIG. 11, a top plan view of a solder pad is shown in accordance with one embodiment, each solder lobe having a straight end.

Figure 12:
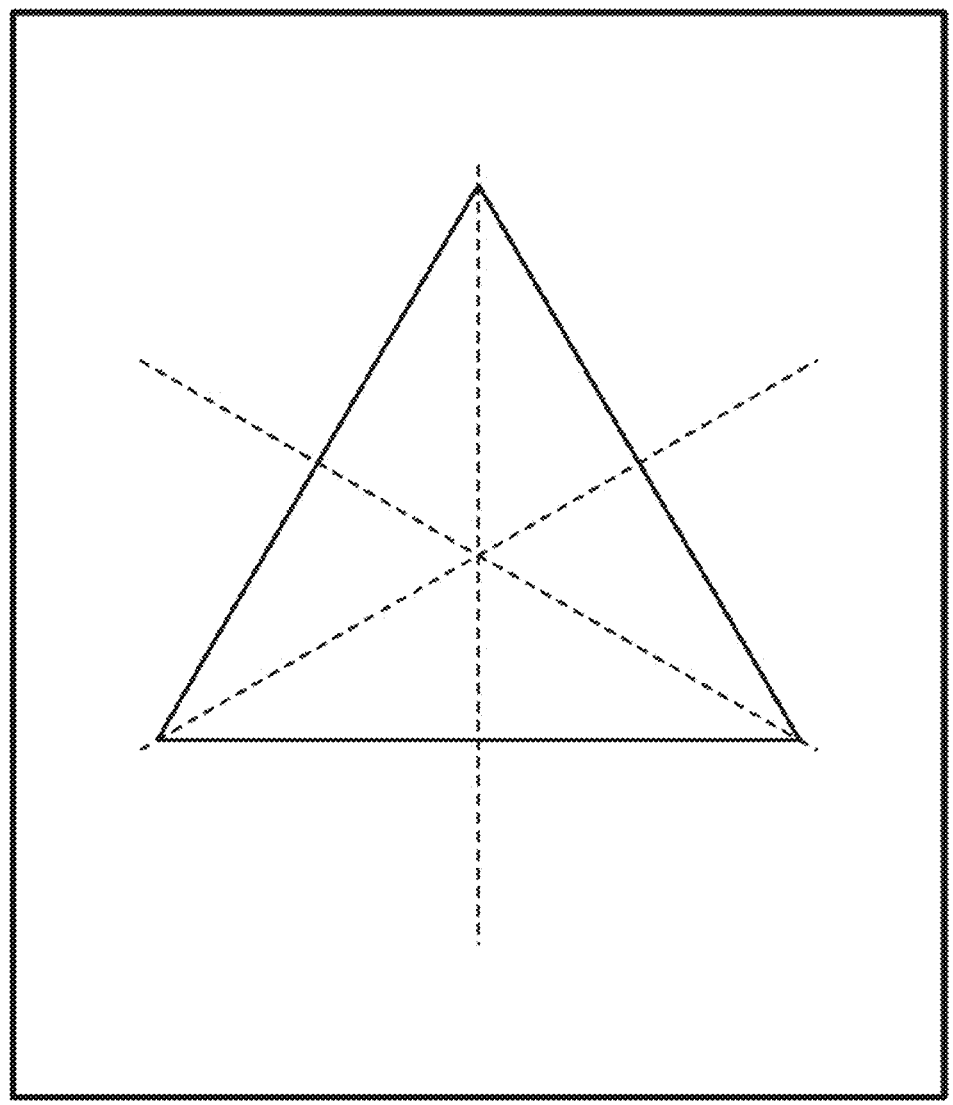
FIG. 12 illustrates a top plan view of a triangular solder pad with symmetrically extending corners of the triangular solder pad along three radial axes from the center of pad in accordance with one embodiment.

Referring to FIG. 12, a top plan view of a solder pad with symmetrically extending corners of the triangular solder pad along three radial axes from the center of pad is shown in accordance with one embodiment. The simplest form of a radial arrangement of spires is a triangle because it embodies the minimum number of radial axis necessary to achieve the desired centering effect.

Figure 13:
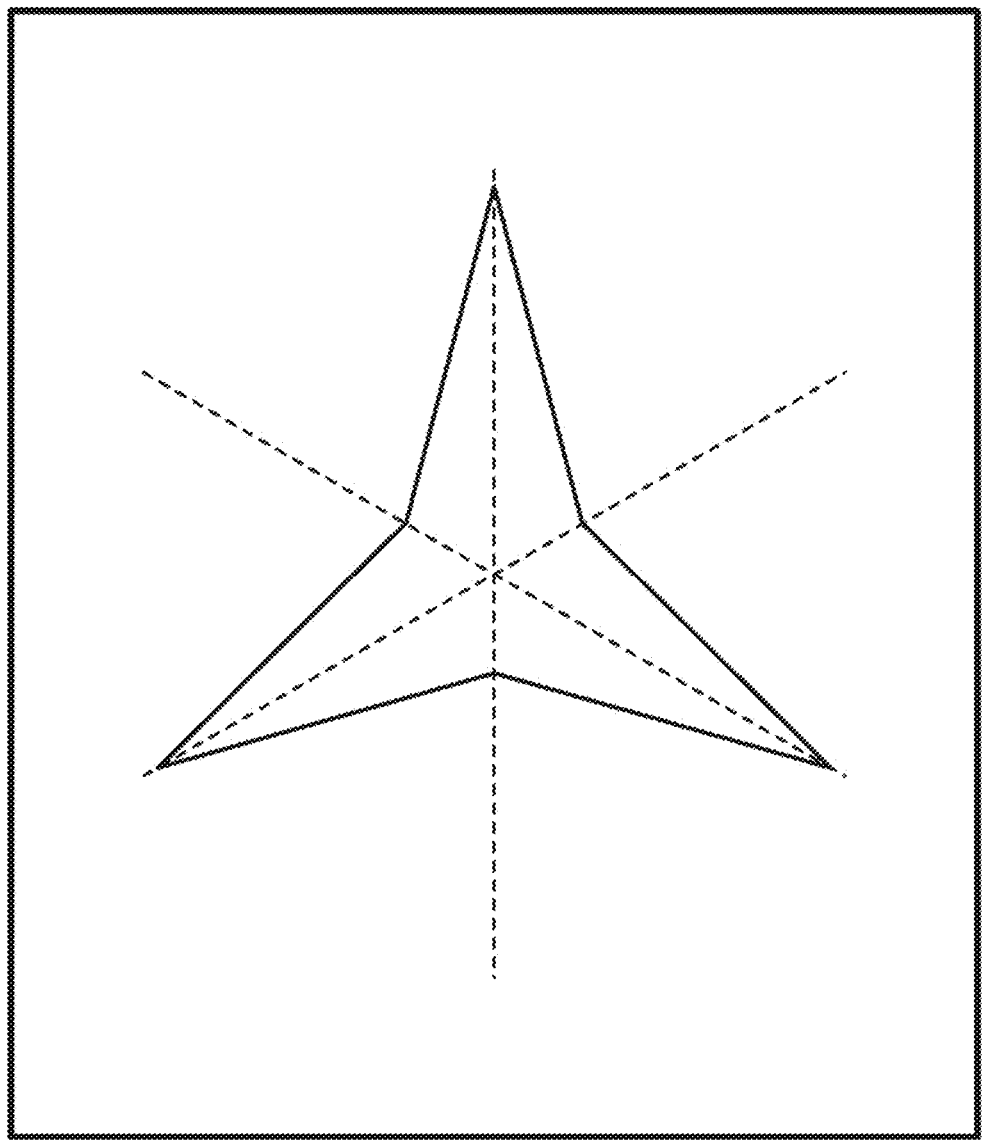
FIG. 13 illustrates a top plan view of a solder pad with three or more solderable spires, each solderable spire symmetrically extending along a radial axis, in accordance with one embodiment.

Referring to FIG. 13, a top plan view of a solder pad with three or more solderable spires is shown in accordance with one embodiment, each solderable spire symmetrically extending along a radial axis. The triangular solder pad shown in FIG. 12 can be modified by pulling in the sides and increasing the length of its edges about the radial axis as shown in FIG. 13. Increasing the length of the edges along an axis means that the surface tension force of the solder will be more aligned with the axis.

Figure 14:
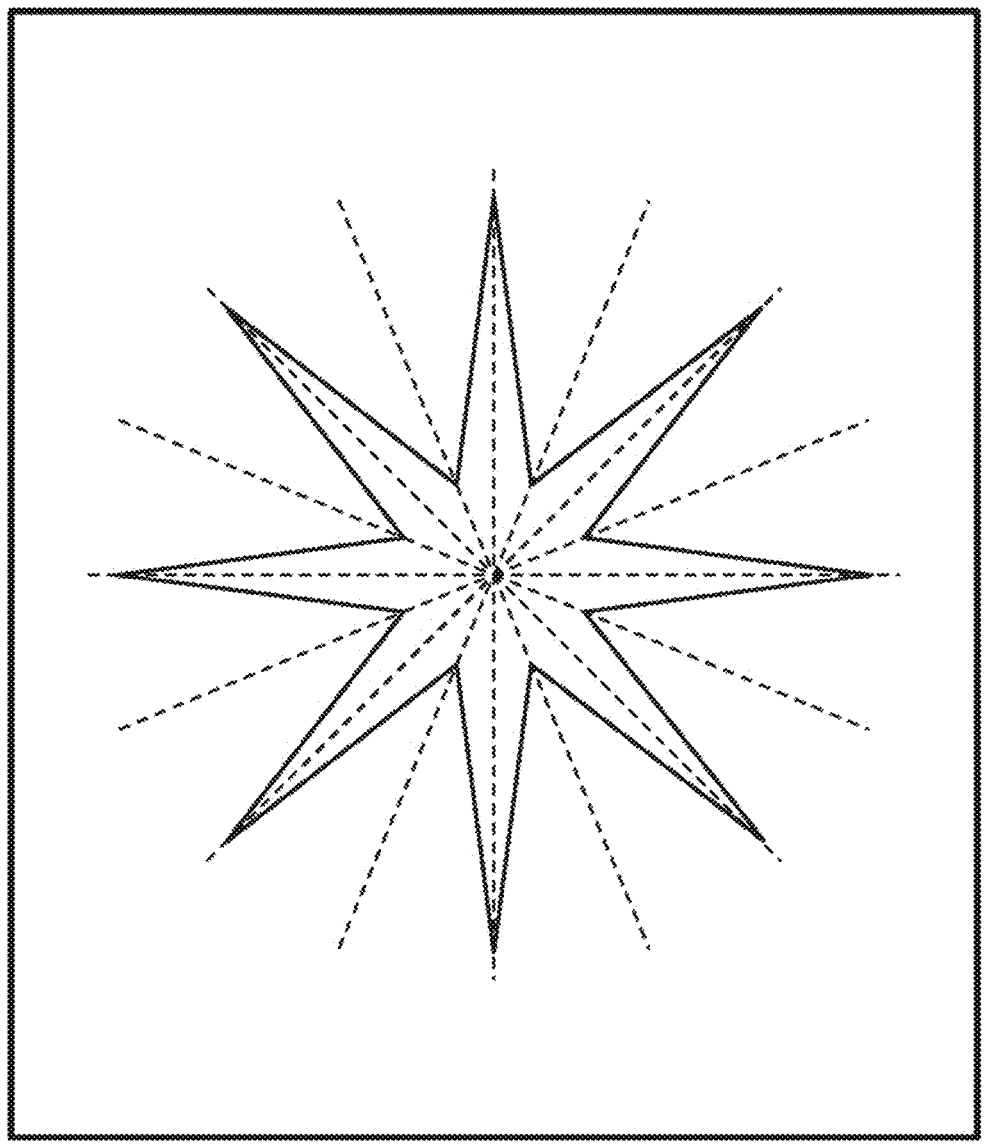
FIG. 14 illustrates a top plan view of a solder pad with solderable spires symmetrically extending along radial axes in accordance with one embodiment.

Referring to FIG. 14, a top plan view of a solder pad with solderable spires symmetrically extending along radial axes is shown in accordance with one embodiment.

A variety of alignment forces play a role in the movement or alignment of a component during the soldering process. Four primary alignment forces or solder wetting forces include gravity (see e.g., FIG. 16), friction (see e.g., FIG. 15), surface tension (see e.g., FIG. 17), and intermolecular/inter-atomic attraction forces (see e.g., FIG. 18). These solder wetting forces combine in a solder connection to determine how the solder will wet along the surface of a solder pad (see e.g., FIG. 19). The combinations of these solder wetting forces have directional components to them with respect to the solder, the component, and the board. Two of the forces, surface tension and friction, have a negative component that prevents wetting of solder. The third force, gravity could have a negative or positive effect depending on the orientation of the component. In the case of a surface mount component, the force of gravity would be positive force. The fourth force, intermolecular, generally has the effect of pulling the solder out along the surface thus having a positive effect on solder wetting. In many configurations, the inter-atomic attraction or intermolecular force component is one of the strongest force components.

Figure 15:
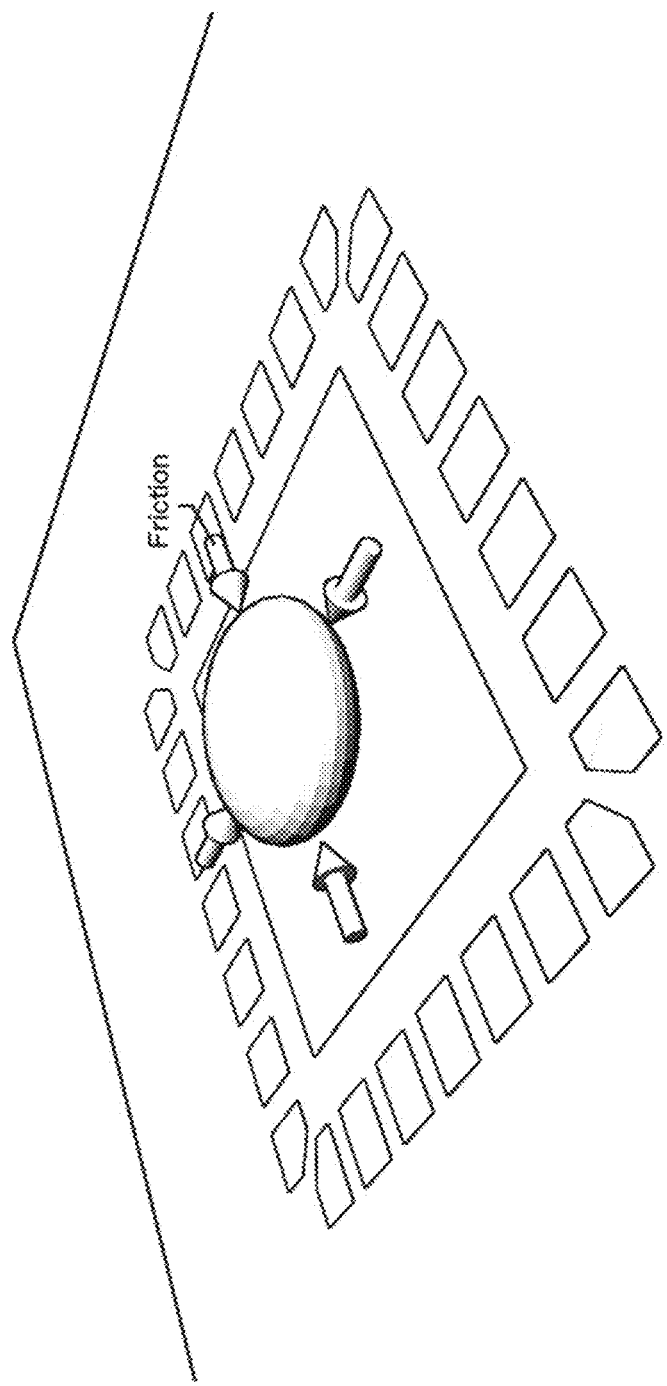
FIG. 15 illustrates a friction force resisting wetting of solder on a perspective view of a solder pad in accordance with one embodiment.

Referring to FIG. 15, friction forces resisting wetting of solder on a perspective view of a solder pad is shown in accordance with one embodiment.

Figure 16:
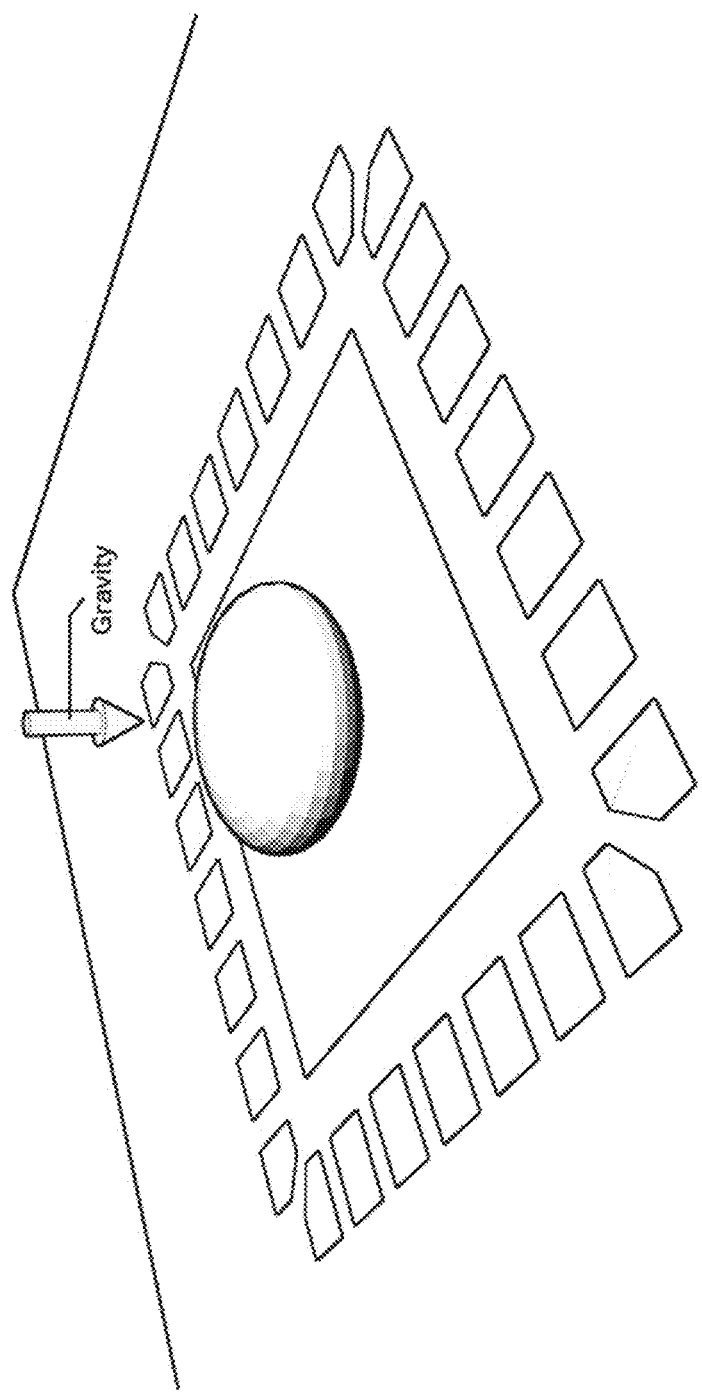
FIG. 16 illustrates a gravity force influencing wetting of solder on a perspective view of a solder pad in accordance with one embodiment.

Referring to FIG. 16, potential gravity forces influencing wetting of solder are shown using a perspective view of a solder pad in accordance with one embodiment.

Of the identified solder wetting forces, two are redirectable. Specifically, the redirectable solder wetting forces are surface tension forces (see e.g., FIG. 17) and intermolecular forces (see e.g., FIG. 18). The intermolecular and surface tension forces that are involved in the proper wetting action of solder flowing over the extent of a pad surface tending to balance forces between the surface mounted component and the pad in such a way as to have a central point where the forces are in balance the residual effect of which is the centering of the component with respect to the pad. The shape of solder pad has a constraining effect on the forces involved in the wetting of solder. The shape of the pad will serve to change the direction the forces and thus change the way the direction at which these forces are applied to the component.

Figure 17:
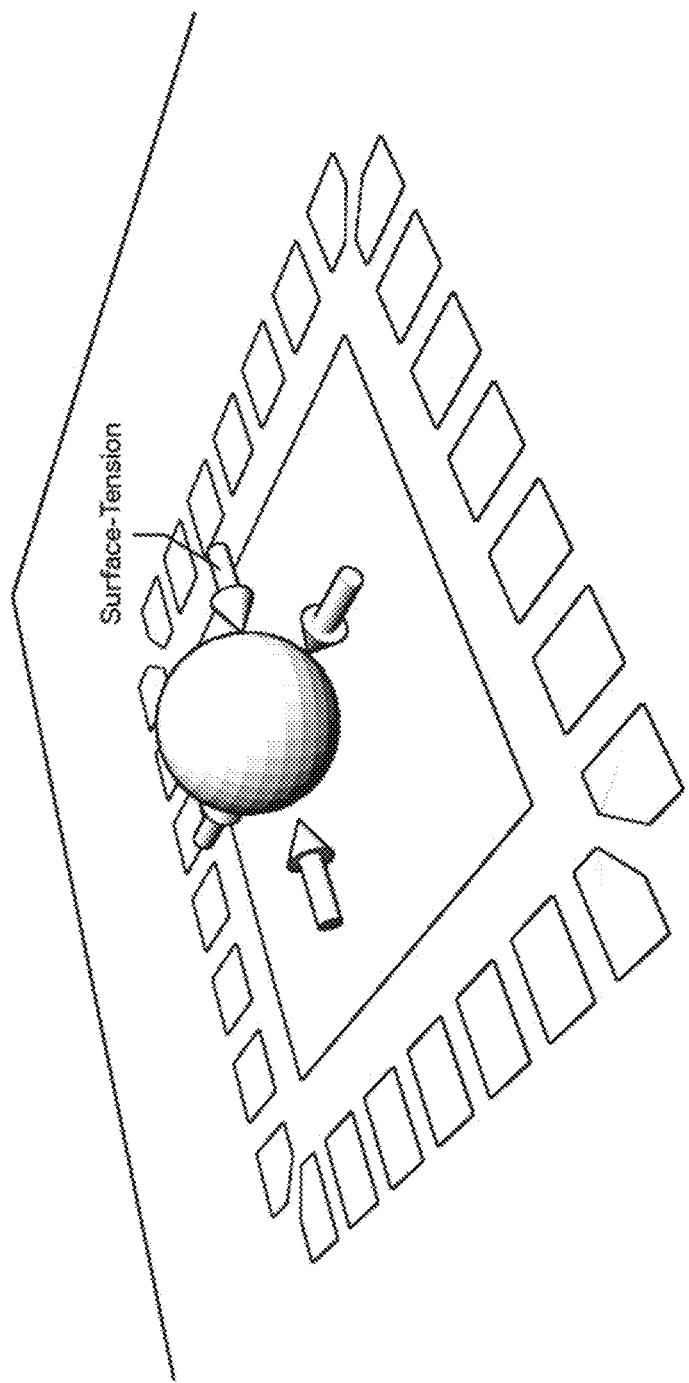
FIG. 17 illustrates a surface tension force influencing wetting of solder on a perspective view of a solder pad in accordance with one embodiment.

Referring to FIG. 17, surface tension forces influencing wetting of solder on a perspective view of a solder pad are shown in accordance with one embodiment.

Figure 18:
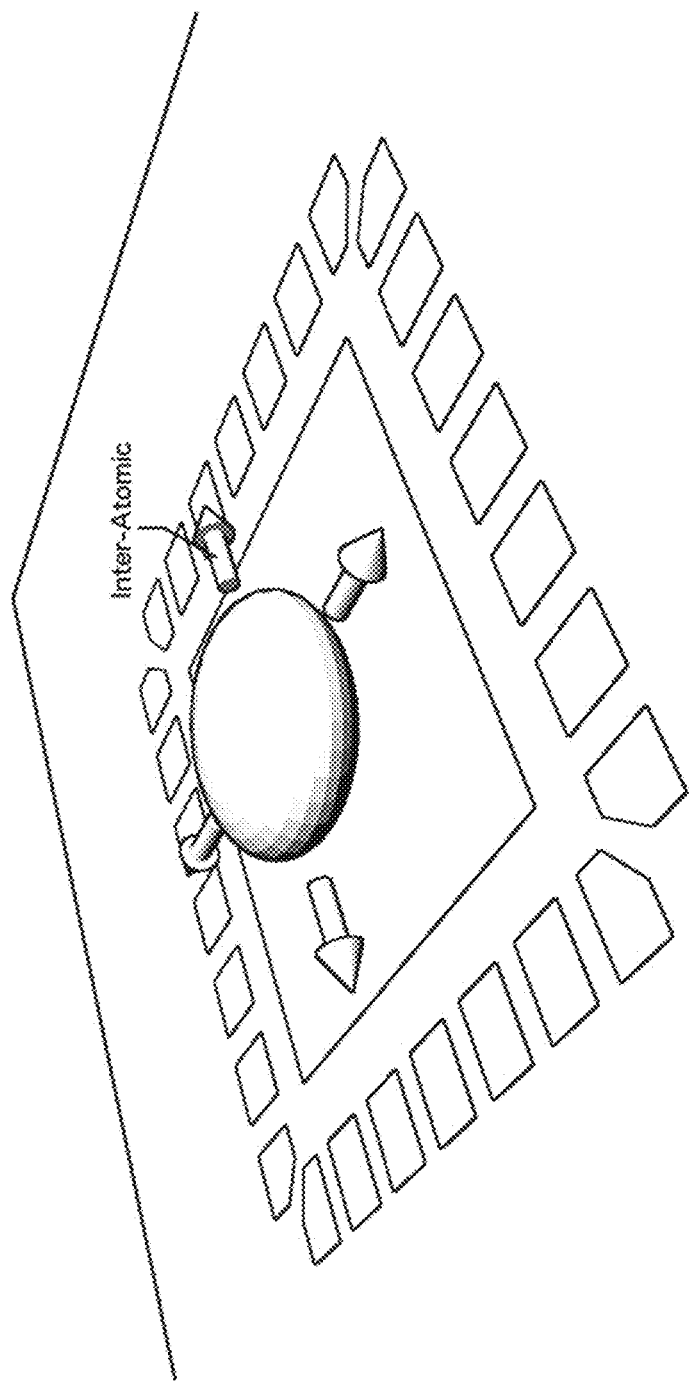
FIG. 18 illustrates an intermolecular/inter-atomic attraction force influencing wetting of solder on a perspective view of a solder pad in accordance with one embodiment.

Referring to FIG. 18, intermolecular/inter-atomic attraction forces influencing wetting of solder on a perspective view of a solder pad are shown in accordance with one embodiment. The edge of the pad on a component serves as a boundary where the intermolecular/Atomic-Attractive forces pull up-to. The solder will not wet beyond the pad so in most embodiments the shape of the pad edge constrains the intermolecular atomic forces. In a typical circular center pad on a component, the force will align more along an outward axis and not provide rotational effects as the solder wets in part due to the edges of the pad being parallel to the center. With the described embodiments of the radial center pad, the forces align to allow the solder to wet down the length of the pads and then out perpendicular to the radial axis.

In one embodiment, the generation of the pad edge may be accomplished by plotting the relative position of the two input signals to the center of the pad. In one embodiment, the first input signal specifies the current angular position of the next input point that is derived from a point being moved around a central point. A sign wave could be used to generate the rotation of the point around a center point (0, 0) in a polar coordinate system with the angle being measured in radians.

The second input would represent a sign wave that would be used to vary the radius of the rotating point as it rotated around the center point. The number of lobes generated on the center pad could be derived from the formula:

number lobes=radius modulating frequency/rotation frequency

For example: If the point is rotated around a center axis at a frequency of 1 revolution per second and the radius of the point is moved in and out along the radius using a sinusoidal pattern of three waves per second, then a center pad with three lobes would be generated.

In many embodiment, the solder pads on the component and circuit match. However, in at least one embodiment, solder pads of the same relative size are compatible whenever the number of lobes on the solder pad with the most lobes is a multiple of the number of lobes on the solder pad with the fewest lobes. Thus, a solder pad with three lobes might be soldered to a solder pad with six lobes, nine lobes, twelve lobes, fifteen lobes, or some other multiple-of-three-lobe total.

Figure 19:
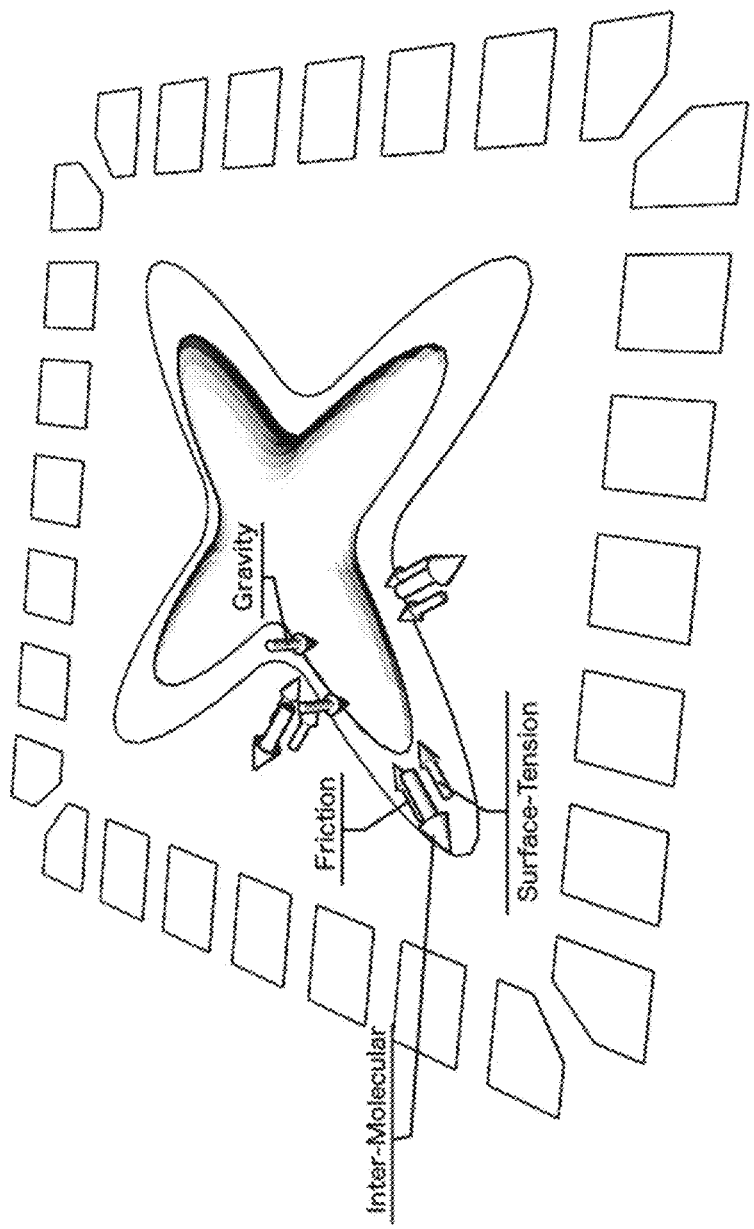
FIG. 19 illustrates a perspective view of a solder pad with a radial center pad portion and interaction of forces influencing wetting of solder on the solder pad in accordance with one embodiment.

Referring to FIG. 19, a perspective view of a solder pad with a radial center pad portion show the interaction of various forces influencing wetting of solder on the solder pad in accordance with one embodiment.

In one embodiment, the center portion of the radial solder pad can be changed to constrain the intermolecular/Atomic-Attractive forces and to form a balanced tension along the edges of the pad as the solder wets out to the edge of the pad.

The tension and direction of forces takes on relative to the shape of the solder and of the pad. As the solder flows out to the edges of the solder pad, the forces align perpendicular to the edge and create a balance and tension between the positive (gravity and atomic attraction) and negative (surface tension and friction) forces. The tension between the forces will be aligned towards the edge of the pad as the pad shape determines the direction of outward pull or flow of the solder due to gravity and atomic attraction. The surface tension and friction forces will always pull in and oppose the movement of the solder in an outward direction.

Figure 20:
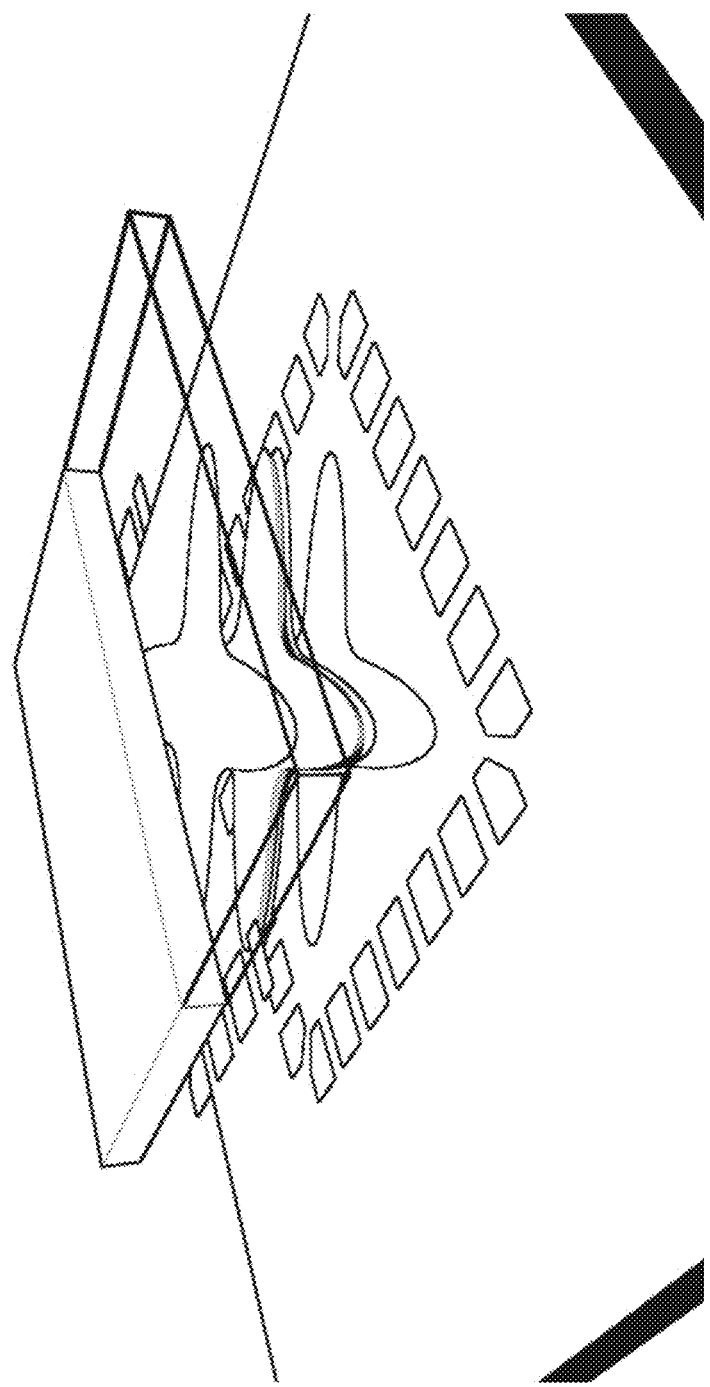
FIG. 20 illustrates an exploded perspective view of a component (cut-away) having a solder pad with a radial center pad portion, solder, and a circuit board having a matching solder pad with a radial center pad portion in accordance with one embodiment.

Referring to FIG. 20, an exploded perspective view of a component (cut-away) having a solder pad with a radial center pad portion, solder, and a circuit board having a matching solder pad with a radial center pad portion are shown in accordance with one embodiment.

Figure 21:
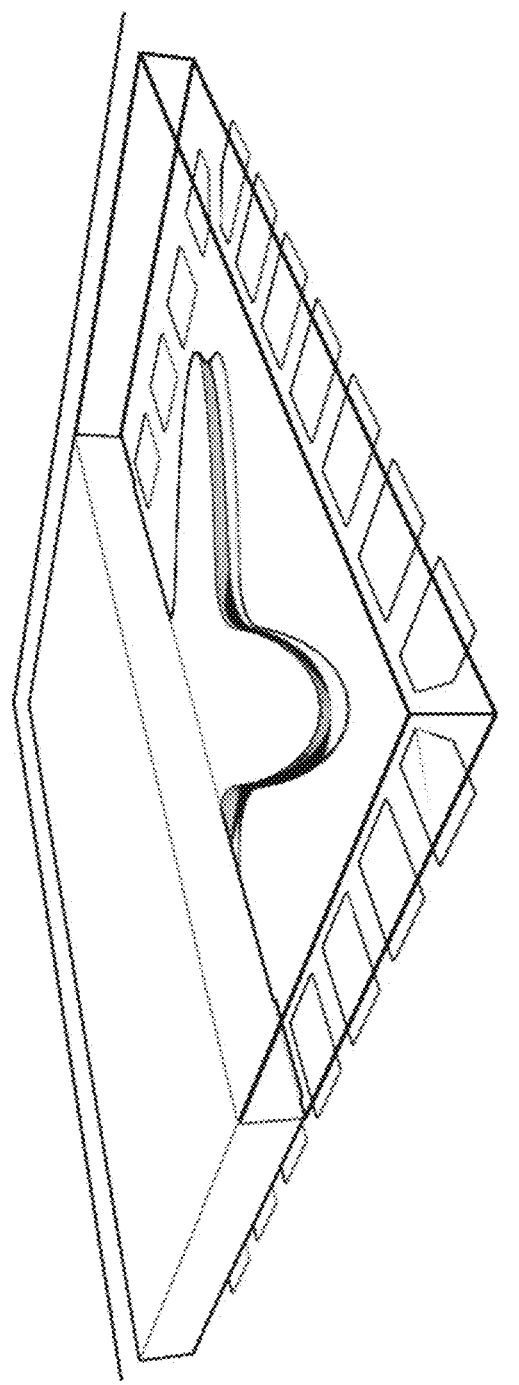
FIG. 21 illustrates a perspective view of a component (cut-away) having a solder pad with a radial center pad portion, solder, and a circuit board having a matching solder pad with a radial center pad portion in accordance with one embodiment.

Referring to FIG. 21, a perspective view of a component (cut-away) having a solder pad with a radial center pad portion, solder, and a circuit board having a matching solder pad with a radial center pad portion are shown in accordance with one embodiment.

Referring to FIG. 22, a side view of a cross section of a component that has been soldered to the circuit board is shown. The larger pads depicted on the left attached to the component and the circuit board are matching center pads that both have a radial pattern of lobes extending out from the center of the component and from the center for the component installation footprint on the circuit board. The smaller pads on the right side of the diagrams, on the component and on the circuit board, represent the pads of the Integrated Circuit and the corresponding component installation footprint which are distributed around the circumference of the component and its corresponding installation site on the circuit board.

Although specific embodiments have been illustrated and described herein, a whole variety of alternate and/or equivalent implementations may be substituted for the specific embodiments shown and described without departing from the scope of the present disclosure. This application is intended to cover any adaptations or variations of the embodiments discussed herein.

What is claimed:

1. A solder pad layout on a first component/substrate that matches, in size and shape, an opposing solder pad on a second component/substrate, the solder pad layout comprising:
   a center pad portion that is centrally positioned within a placement area for connecting the first component/substrate and the second component/substrate; and
   at least three radial lobe portions coupled to the center pad portion,
      wherein the at least three radial lobe portions are positioned radially equidistant about the center pad portion,
      wherein the number of the at least three radial lobe portions is odd, and
      wherein the first component/substrate comprises an integrated circuit package having a pin 1, and wherein the at least three radial lobe portions include an indicator spire aligned on a radial axis pointed perpendicular to the edge of a side of the integrated circuit package having a defined relative relationship to pin 1 of the integrated circuit package,
   such that the at least three radial lobe portions produce increased rotational alignment forces relative to alignment forces associated with the center pad portion alone by increasing the ratio of the amount of pad edge to pad area.

2. The solder pad layout of claim 1, wherein the center pad portion includes a center pre-fill area that provides an indication of the amount of solder that should be pre-filled on the pad to improve the solderability of a package.

3. The solder pad layout of claim 1, wherein the first component/substrate comprises an integrated circuit package and the second component/substrate comprises a circuit board, wherein solder is between the package and the board, and wherein the at least three radial lobe portions include pad spires that act as expansion reservoirs that solder can flow into, allowing the package to drop to the board.

4. The solder pad layout of claim 1, wherein the first component/substrate comprises an integrated circuit package and wherein the at least three radial lobe portions include pad spires that provide increased rotational alignment forces as solder wets outward from the center of the package by providing an edge along which the counter balancing forces of surface tension and intermolecular attraction can align.

5. The solder pad layout of claim 1, wherein the at least three radial lobe portions include pad spires that narrow as the pad spires extend outward providing centering forces as solder wets outward into an increasingly smaller reservoir.

6. The solder pad layout of claim 1, wherein the at least three radial lobe portions include pad spires that provide centering forces due to their orientation in a pattern extending outward from the center pad portion.

7. The solder pad layout of claim 1, wherein the at least three radial lobe portions include pad spires that increase surface area along the edge of the solder fillets on the center pad portion allowing more heat transfer from the solder to air underneath a component chip.

8. The solder pad layout of claim 1, wherein the solder pad layout with the center pad portion and the at least three radial lobe portions reduces the overall weight of the package, board, and solder used to fix a component to a circuit board relative to a comparable circular or rectangular solder pad.

9. The solder pad layout of claim 1, wherein the solder pad layout with the center pad portion and the at least three radial lobe portions uses less copper material in an end product board and component and uses less solder, resulting in material cost reduction and/or increased material recapture relative to a comparable circular solder pad with at least the same diameter or rectangular solder pad with at least the same width and/or height.

10. The solder pad layout of claim 1, wherein the first component/substrate comprises an integrated circuit package that is substantially rectangular, having four side edges, and the number of the at least three radial lobe portions is three, five, seven, or nine.

11. The solder pad layout of claim 1, wherein the at least three radial lobe portions include curves in the shape of the lobe portions.

12. A radial solder pad comprising:
   a center pad that is centrally positioned on a bottom surface of an integrated circuit package; and
   three or more spires which are radially symmetrical around the center pad,
      wherein the number of the three or more spires is odd, and
      wherein the integrated circuit package has a pin 1, and wherein the three or more spires include an indicator spire aligned on a radial axis pointed perpendicular to the edge of a side of the integrated circuit package having a defined relative relationship to pin 1 of the integrated circuit package,
   such that the three or more spires produce increased rotational alignment forces and increased centering forces during package soldering when aligned to a radial solder pad of matching shape and size on the surface of a circuit board.

13. The radial solder pad of claim 12, wherein the three or more spires include curves in the shape of the spires.

14. The radial solder pad of claim 12, wherein the integrated circuit package is substantially rectangular, having four side edges, and the number of the three or more spires is three, five, seven, or nine.

* * * * *